United States Patent
Ando et al.

(10) Patent No.: US 9,515,164 B2
(45) Date of Patent: Dec. 6, 2016

(54) METHODS AND STRUCTURE TO FORM HIGH K METAL GATE STACK WITH SINGLE WORK-FUNCTION METAL

(71) Applicant: International Business Machines Corporation, Armonk, NY (US)

(72) Inventors: Takashi Ando, Tuckahoe, NY (US); Balaji Kannan, Fishkill, NY (US); Siddarth Krishnan, Peekskill, NY (US); Unoh Kwon, Fishkill, NY (US); Shahab Siddiqui, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/198,976

(22) Filed: Mar. 6, 2014

(65) Prior Publication Data

US 2015/0255463 A1 Sep. 10, 2015

(51) Int. Cl.
| | |
|---|---|
| *H01L 29/66* | (2006.01) |
| *H01L 21/28* | (2006.01) |
| *H01L 29/51* | (2006.01) |
| *H01L 29/49* | (2006.01) |
| *H01L 21/8238* | (2006.01) |
| *H01L 27/092* | (2006.01) |

(52) U.S. Cl.
CPC ... *H01L 29/66545* (2013.01); *H01L 21/28088* (2013.01); *H01L 21/28185* (2013.01); *H01L 21/28238* (2013.01); *H01L 21/823842* (2013.01); *H01L 27/092* (2013.01); *H01L 29/4966* (2013.01); *H01L 29/517* (2013.01)

(58) Field of Classification Search
None
See application file for complete search history.

(56) References Cited

U.S. PATENT DOCUMENTS

| | | |
|---|---|---|
| 7,838,908 B2 | 11/2010 | Kwon et al. |
| 8,309,419 B2 | 11/2012 | Schaeffer et al. |
| 8,378,498 B2 | 2/2013 | Blackshear |
| 8,420,473 B2 | 4/2013 | Ando et al. |
| 8,445,344 B2 | 5/2013 | Carter et al. |
| 8,450,946 B1 | 5/2013 | Lunn et al. |
| 8,581,351 B2 | 11/2013 | Ando et al. |
| 8,809,176 B2 | 8/2014 | Ando et al. |
| 9,040,404 B2 | 5/2015 | Ando et al. |
| 2002/0100947 A1* | 8/2002 | Lee et al. ............... 257/412 |
| 2011/0057267 A1 | 3/2011 | Chuang et al. |
| 2012/0061772 A1 | 3/2012 | Guo et al. |
| 2012/0139053 A1* | 6/2012 | Ando et al. ............. 257/369 |
| 2012/0280288 A1 | 11/2012 | Ando et al. |
| 2013/0049123 A1 | 2/2013 | Baars et al. |
| 2013/0082332 A1 | 4/2013 | Liu et al. |
| 2013/0161697 A1 | 6/2013 | Ponoth et al. |

(Continued)

*Primary Examiner* — Shaun Campbell
*Assistant Examiner* — Aneta Cieslewicz
(74) *Attorney, Agent, or Firm* — L. Jeffrey Kelly

(57) ABSTRACT

A method for forming a replacement metal gate structure sharing a single work function metal for both the N-FET and the P-FET gates. The method oppositely dopes a high-k material of the N-FET and P-FET gate, respectively, using a single lithography step. The doping allows use of a single work function metal which in turn provides more space in the metal gate opening so that a bulk fill material may occupy more volume of the opening resulting in a lower resistance gate.

20 Claims, 7 Drawing Sheets

(56) References Cited

U.S. PATENT DOCUMENTS

| | | |
|---|---|---|
| 2013/0161764 A1 | 6/2013 | Wong et al. |
| 2013/0187236 A1 | 7/2013 | Xie et al. |
| 2013/0256802 A1 | 10/2013 | Jagannathan et al. |
| 2013/0299922 A1* | 11/2013 | Choi ................ H01L 21/82345 257/412 |
| 2014/0001570 A1* | 1/2014 | Brodsky ........... H01L 21/02321 257/392 |
| 2014/0110791 A1* | 4/2014 | Clark ............................ 257/369 |
| 2015/0061027 A1* | 3/2015 | Hong .................. H01L 27/092 257/369 |

\* cited by examiner

US 9,515,164 B2

METHODS AND STRUCTURE TO FORM HIGH K METAL GATE STACK WITH SINGLE WORK-FUNCTION METAL

BACKGROUND OF THE INVENTION

1. Field of the Invention

The present invention generally relates to Metal Oxide Semiconductor Field Effect Transistors (MOSFETs) made on a semiconductor substrate. In particular, the invention relates to making MOSFETs having a single work-function metal for both the N-FET and the P-FET in a replacement metal gate structure.

2. Description of Related Art

In conjunction with Moore's law, gates of MOSFETs shrink with each technology node. In advanced MOSFETs, the gate may be made from a "replacement metal gate" (RMG) process which requires forming a gate opening in a dielectric layer and filling the gate opening with gate materials as opposed to patterning the gate materials and then surrounding them with a dielectric. Due to the number of work function materials required in current gates, the openings may be difficult to subsequently fill with the bulk material and may result in high gate resistances.

Attempts to create more room for a bulk fill material of a replacement metal gate structure included removing the stack of traditionally used WF metals from the sidewall of the opening. However, there are several drawbacks to work function metal recess: first, it requires several additional photolithography masks, patterning and etch steps; second, the wet etch and reactive ion etch (RIE) processes that are integral to this recess process alter the inherent work functions of the work function metals materials which remain at the bottom of the opening which leads to threshold voltage shifts; third, the repeatability and uniformity of the process is not very good, especially, with varying gate lengths of the transistors within each chip and across the entire wafer; and fourth, with the move to shorter gates (smaller vertical height of the opening) to reduce gate capacitance, the variability and control of work function recess process becomes worse. Thus, there is a need to create more space in the gate opening which provides substantial space for the bulk fill material to achieve low gate resistance while simultaneously providing that the correct work functions are set for N-FETs and P-FETs.

BRIEF SUMMARY OF THE INVENTION

The current invention is a novel structure to both simplify and improve the performance of the replacement metal gate stack for advanced node FETs, and the method of making the same. The current invention allows the correct work functions to be set for N-FETs and P-FETs, while simultaneously allowing substantial space in the gate opening for the bulk fill material which results in lower gate resistance. More specifically, doping of a high-k dielectric film of the gates allows both the N-FET and P-FET gates to share the same, thin, work function metal (single work function metal).

An object of the current invention is a method to form high-k metal gates of a N-FET and a P-FETs by a replacement metal gate process in advanced nodes The replacement metal gate process may be a "high-k first" or a "high-k last" (an embodiment illustrated by the figures) process. The node may be 14 nm and below such that the gate opening may be less than 20 nanometers wide.

A further object of the current invention is that the gates of the N-FET and the P-FET share the same, thin work function metal.

Another object of the current invention is that the gate oxide is doped. The dopants differ in the N-FET gate oxide and the P-FET gate oxide.

Yet a further object of the current invention is to provide a low resistance gate structure by increasing the amount of bulk fill material in the gate opening lined by the work function metal. Despite the gate opening being less than 20 nm, the bulk fill width may be 20-70% of the gate opening width.

An object of the present invention is to form an integrated circuit (IC) including a first gate of an N-FET and a second gate of a P-FET on the substrate wherein the first and second gates have a gate opening width of less than 20 nanonmeters. The IC also includes a work function metal lining both the first gate opening and the second gate opening. Furthermore, a high dielectric material is between the work function metal and the substrate wherein the high dielectric material is doped with an n-dopant in the first gate and is doped with a p-dopant in the second gate. Finally a bulk fill material fills a remainder of gate opening.

Another object of the current invention is a method of forming an N-FET metal gate and a P-FET metal gate sharing the same work function metal, the method comprising. The method provides a dielectric layer over a substrate wherein the dielectric layer has a first opening over an N-FET region of the substrate and a second opening over a P-FET region of the substrate. A high dielectric constant material is formed so as to be in contact with the substrate in the N-FET region and in the P-FET region. A work function metal lines the first and second openings which are subsequently a bulk fill material.

Other characteristics and advantages of the invention will become obvious in combination with the description of accompanying drawings, wherein the same number represents the same or similar parts in all figures.

DETAILED DESCRIPTION OF THE INVENTION

The basic principle of the invention is a method forming oppositely doped high dielectric constant replacement metal gates which have the same work function (WF) metal stack. This is in contrast to normal methods in which work function tuning of an FET is achieved by varying the WF metal materials and thicknesses of materials. Work function tuning is a way to adjust threshold voltages of a device, thus creating two work function regions which, in turn creates two threshold voltage regions.

Figure 1:
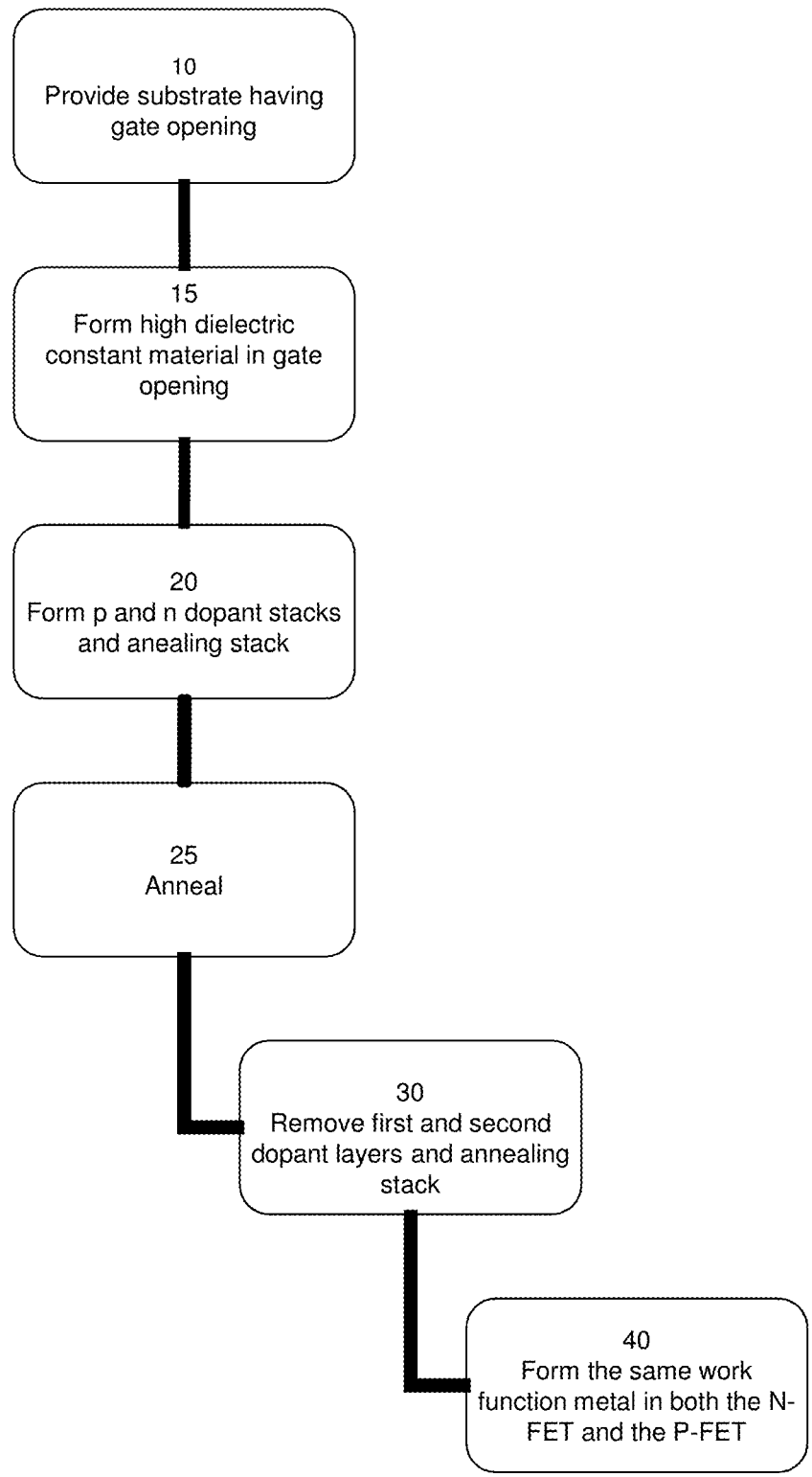
FIG. 1 is a flow chart of an embodiment to create oppositely doped gates of FETs sharing the same work function (herein "WF") metal.

Referring to FIG. 1 a flow chart of steps to create a substrate in which the gates of oppositely doped FETs share the same WF metal according to an embodiment of the present invention is presented. In step 10, dummy gates over the N-FET and P-FET gate regions of the substrate are removed to leave gate openings (which can also be referred to as gate trenches). In step 15 a high dielectric constant material is formed in the gate openings. In step 20, p and n dopant stacks are formed as well as an annealing stack. In step 25 an anneal diffuses the respective dopants into each of the high dielectric constant materials to form first and second gate dielectric stacks. In step 30, following the anneal, the dopant stacks are removed. Next, in step 40 a shared, thin, work function metal is used in both the N-FET and the P-FET. Finally, either with or without a subsequent wetting layer, a bulk fill material is used to fill the opening to complete the gate structure. Then next figures will illustrate embodiments of the structures during the steps of FIG. 1.

Figure 2:
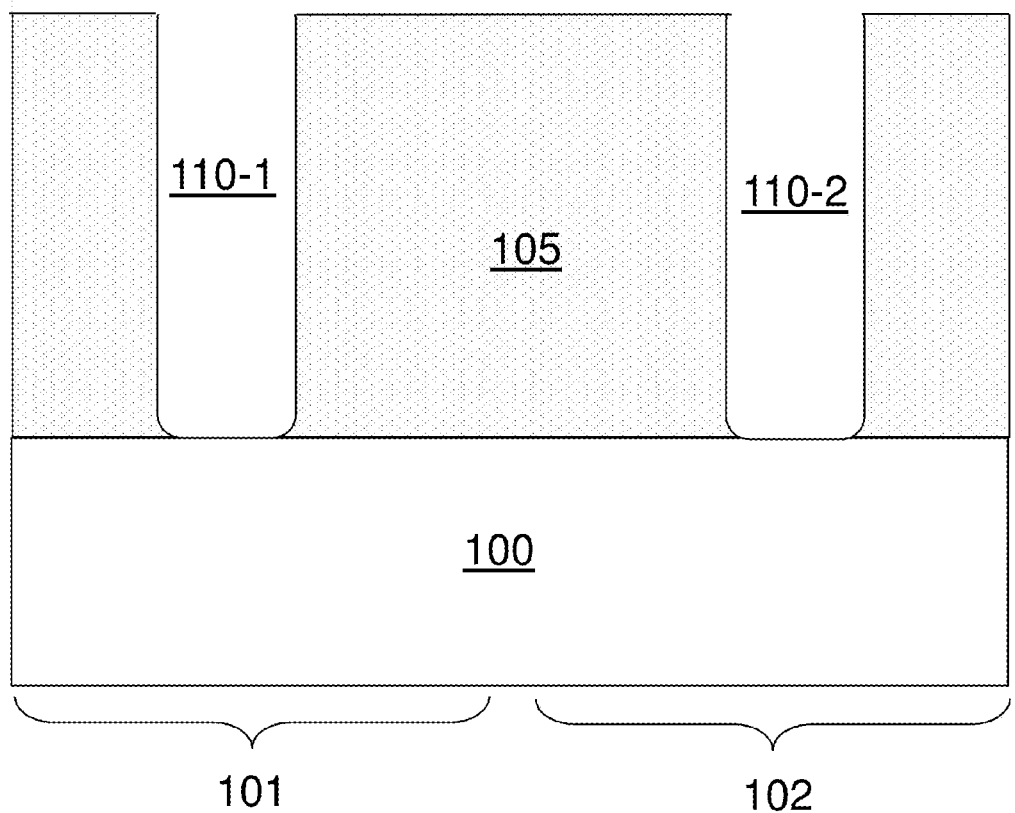
FIG. 2 illustrates a substrate having an overlying dielectric material and openings in the dielectric material according to an embodiment of the present invention.

Referring to FIG. 2, a substrate 100 has a two regions, first region 101 and second region 102. The substrate 100 may be a semiconductor or semiconductor on insulator substrate. The substrate 100 may be planar or may have fins. The first and second regions are oppositely doped regions which will become the N-FET and P-FETs. The substrate 100 has a dielectric layer or layers 105 over it. The dielectric layer has at least one dummy gate opening (110-1 and 110-2) over each of the first and second regions (101 and 102) of the substrate. At this point, the substrate 100 may have source and drain regions on either side of the openings 110-1 and 110-2, which, for simplification, have been omitted from FIG. 1. Likewise, the oppositely doped regions of the substrate 100 may be separated by an isolation (insulation) region which, for simplification, is also not illustrated. The dummy gate openings 110-1 and 110-2 were formed when a dummy gate material was removed. The dummy gate opening dimensions will vary with node, but in a 14 nm node example the openings may be from about 18 to 13 nm wide and ranges in between while the height may be 100 nm to 200 nm high over a buried oxide region in a semiconductor on insulator substrate embodiment.

Figure 3:
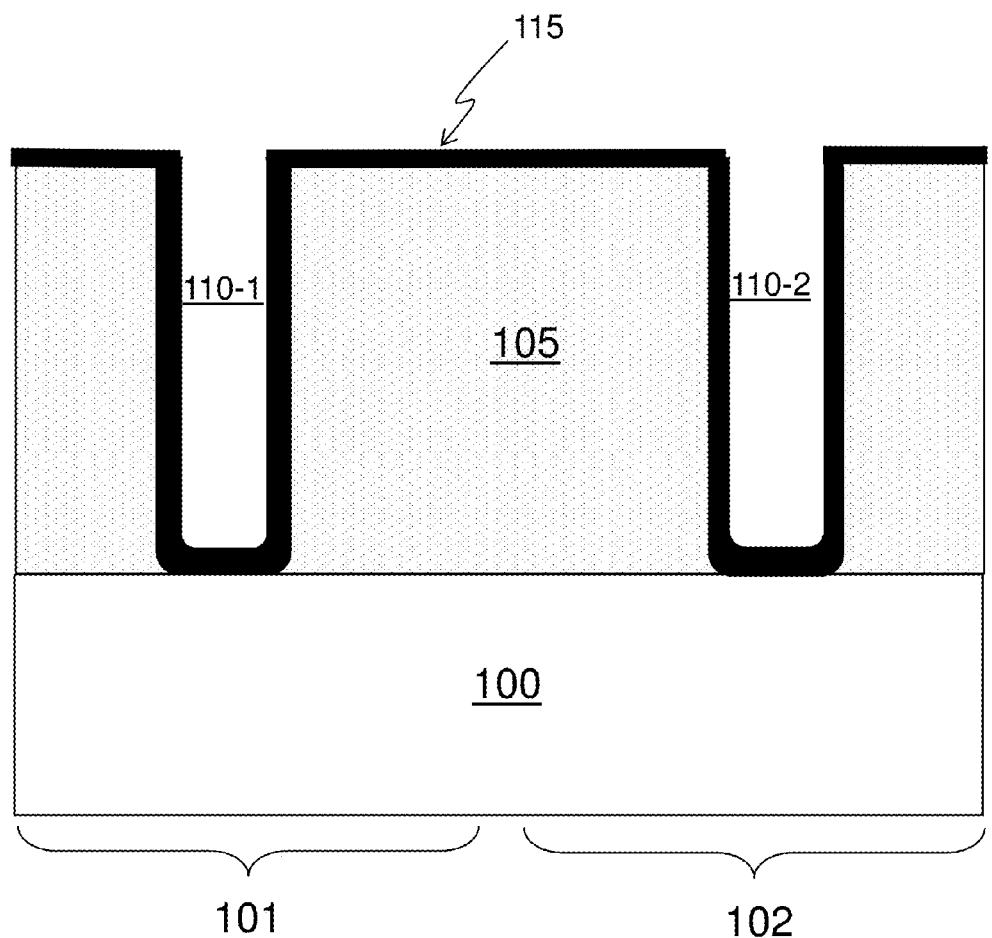
FIG. 3 illustrates a high dielectric constant material lining the openings according to an embodiment of the present invention.

Referring to FIG. 3, the high dielectric constant (herein "high-k") material 115 is formed in the dummy gate openings 110-1 and 110-2. Here, high-k refers to dielectric constants greater than 4 (i.e. greater than the dielectric constant of $SiO_2$). The high-k material 115 may include more than one layer, for example the high-k material may include both an interfacial layer next to the substrate and a higher k material above the interfacial layer. An example interfacial layer may be a silicon oxide or a silicon oxynitride. Examples of higher-k materials include hafnium oxide, hafnium silicate, zirconium oxide, zirconium silicate, aluminum oxide, titanium oxide, yttrium oxide among others.

As shown in FIG. 3, the high-k material lines the dummy gate openings 110-1/110-2, which is a "high-k" last embodiment of a replacement metal gate. However, the high-k material could have also been formed in a "high-k first process". In such a case, the high-k material would only appear at the bottom of the dummy gate openings and not line the sidewalls. The "high-k last" process shown in FIG. 3 has the advantage that the high-k material is not damaged during dummy gate removal. The high-k material 115 may be formed by one or more of an atomic layer deposition, chemical vapor deposition, thermal oxidation, and others. The higher-k portion of the high-k material 115 may be from about 10 Å to about 25 Å thick, and ranges therebetween. The thickness range of the higher-k material is critical for proper subsequent dopant diffusion. Specifically, too thick of a higher-k material results in inadequate diffusion of dopant. Too thin of a higher-k material results in dopants in direct contact with interfacial layer and increase the Tiny (inverse of gate capacitance) or cause gate leakage issues.

Figure 4A:
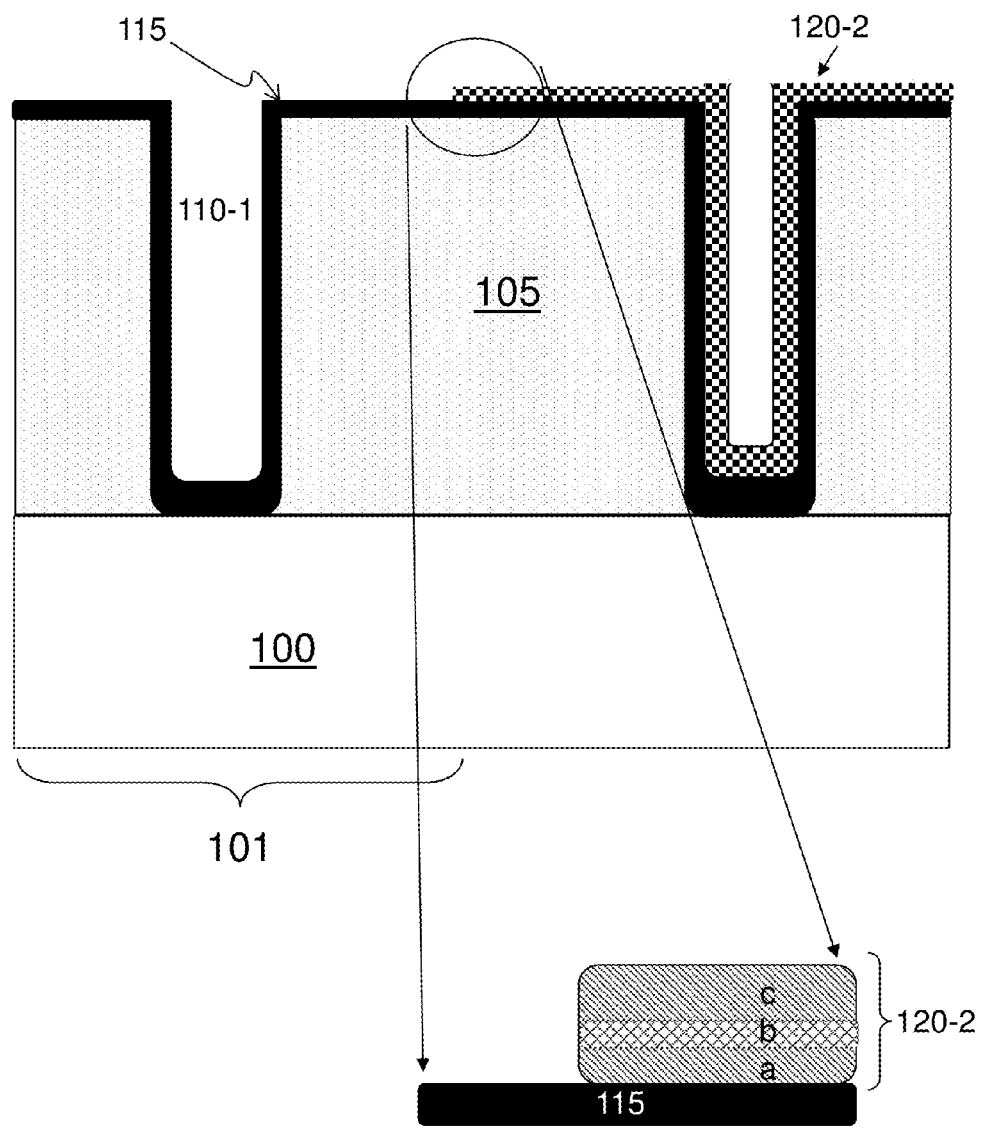
FIG. 4a illustrates a p-dopant stack formed over the second region of the substrate according to an embodiment of the present invention.

Referring to the FIG. 4 series, first and second dopant layers will be formed. For the purposes of this example, the first region 101 of the substrate 100 may be an N-FET region and the second region 102 may be a P-FET region. In FIG. 4a, a p-dopant stack 120-2 may be initially formed everywhere and then removed over the N-FET region 101. Here, the p-dopant 120-2 may be a tri-layer, from bottom to top, of a (a) first titanium nitride layer, (b) aluminum (Al) or an aluminum containing layer, and a (c) second titanium nitride layer. The thickness of the first titanium nitride layer (120-2a) is from about 5 Å to about 30 Å and ranges therebetween. The thickness of the aluminum containing layer (120-2b) is from about 5 Å to about 30 Å ranges therebetween. The thickness of the second titanium nitride layer (120-2c) is from about 5 Å to about 30 Å and ranges therebetween. If the p-dopant stack 120-2 is too thick the dummy gate opening 110-2 will be clogged. If there is too little or too much (depending on the specific layer) the threshold voltage (Vt) will shift too much or too little because the dopant will diffuse too much or too little. For example, if the second TiN layer (120-2c) is too thin Lanthanum get into the PFET gate stack. Likewise, if these layers are too thin or too thick, gate leakage may increases due to suboptimal subsequent dopant diffusion. Specifically, too much dopant (for example, Aluminum) will reduce the dielectric constant of the high-k material which inturn increases gate leakage.

Figure 4B:
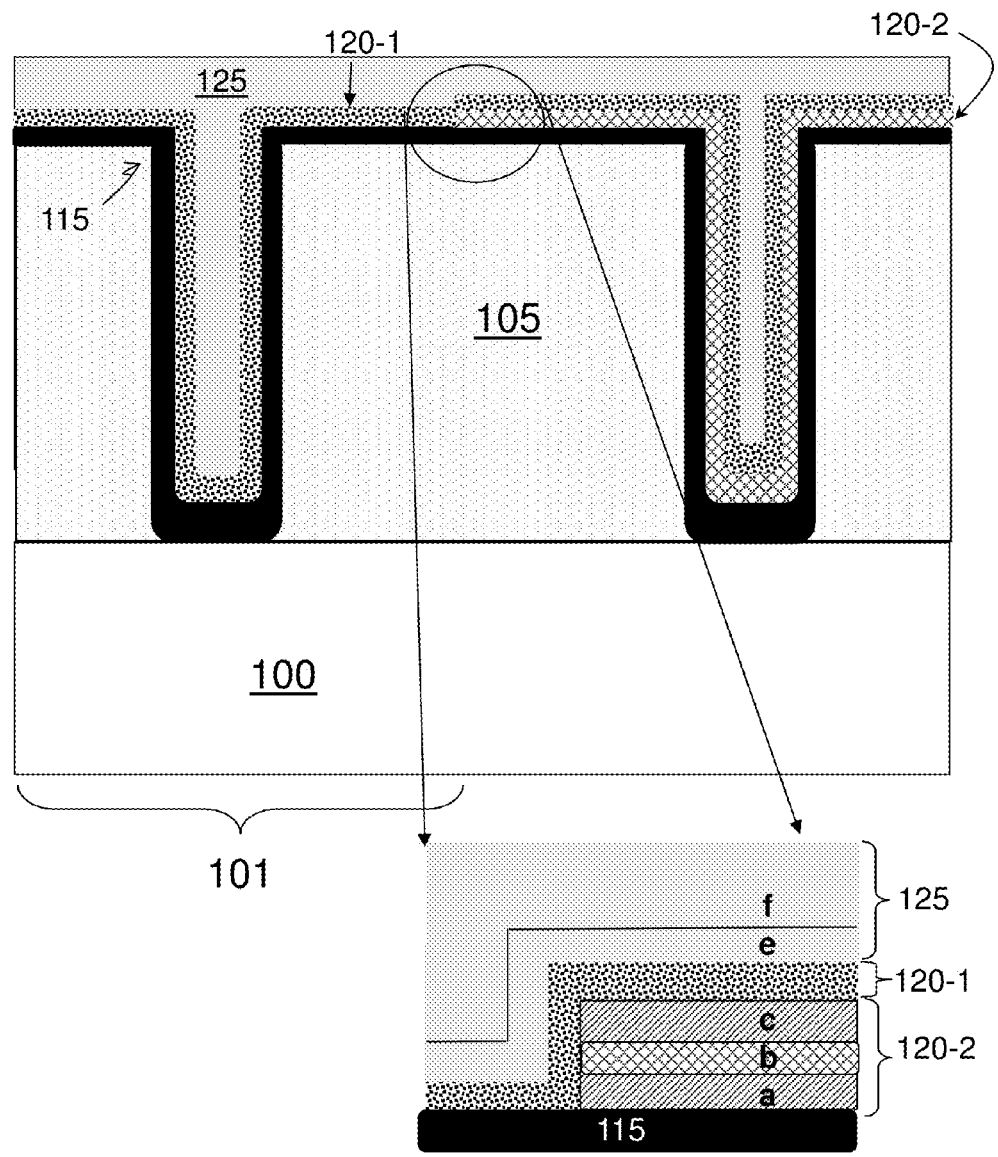
FIG. 4b illustrates a n-dopant stack formed over the substrate according to an embodiment of the present invention.

Referring to FIG. 4b, an n-dopant stack 120-1 may be formed everywhere on the substrate along with an annealing stack 125. Thus, in the N-FET region 101 of the substrate 100 there exists one dopant stack (the n-dopant stack 120-1) while in the P-FET region 102 of the substrate 100 there exist two dopant stacks (p-dopant 120-2 under the n-dopant 120-1). The n-dopant stack may be lanthanum (La) or a lanthanum containing film such as lanthanum oxide ($La_2O_3$), or some other rare earth dopant such as yttrium which shifts the effective work function to towards the conduction band-edge. The thickness of the n-dopant stack 120-1 is from about 1 Å to about 10 Å and ranges therebetween. Like the p-dopant, if the n-dopant layer is too thick or thin, gate leakage, Vt shift and blocking of the dummy gate opening 110-1 may occur.

Still referring to FIG. 4b, the annealing stack 125 may comprise a bottom cap titanium nitride (e) film and a top amorphous silicon film (f). The thickness of the cap film (e) may be from about 5 Å to about 30 Å and ranges therebetween. The thickness of the top amorphous silicon film may be from about 20 Å to about 200 Å and ranges therebetween. The purpose of the stack is to block extrinsic oxygen from diffusing into the gate stack during the anneal. Oxygen in the gate stack increases Tiny. When the oxygen blocking component of the anneal stack is silicon, an buffer layer (for example TiN) is formed between the silicon and the high-k material to prevent the silicon from forming a silicide with the high-k material. Silicides can lead to surface roughing and gate leakage.

The structure shown in FIG. 4b is annealed to drive the n and p dopants from their respective stacks 120-1 and 120-2 into the high-k material 115 of each FET region. Thereafter, the dopant and annealing stacks are removed to yield FIG. 5. The anneal may be from about 800 C. to about 1300 C. and ranges therebetween. If the temperature is too low the dopants will not diffuse sufficiently into the high-k material 115 and there will be no shift in the threshold voltage. If the temperature is too high, too much dopant moves close to the substrate 100 causing a change in crystallization of the high-k material which may lead to severe gate leakage. The anneal may be performed by a soak anneal (several seconds), spike/rapid thermal anneal (RTA) which is a few seconds, or a laser anneal (LSA) which is milliseconds. Typically, the anneal is performed in inert ambient such as nitrogen and/or argon.

Figure 5:
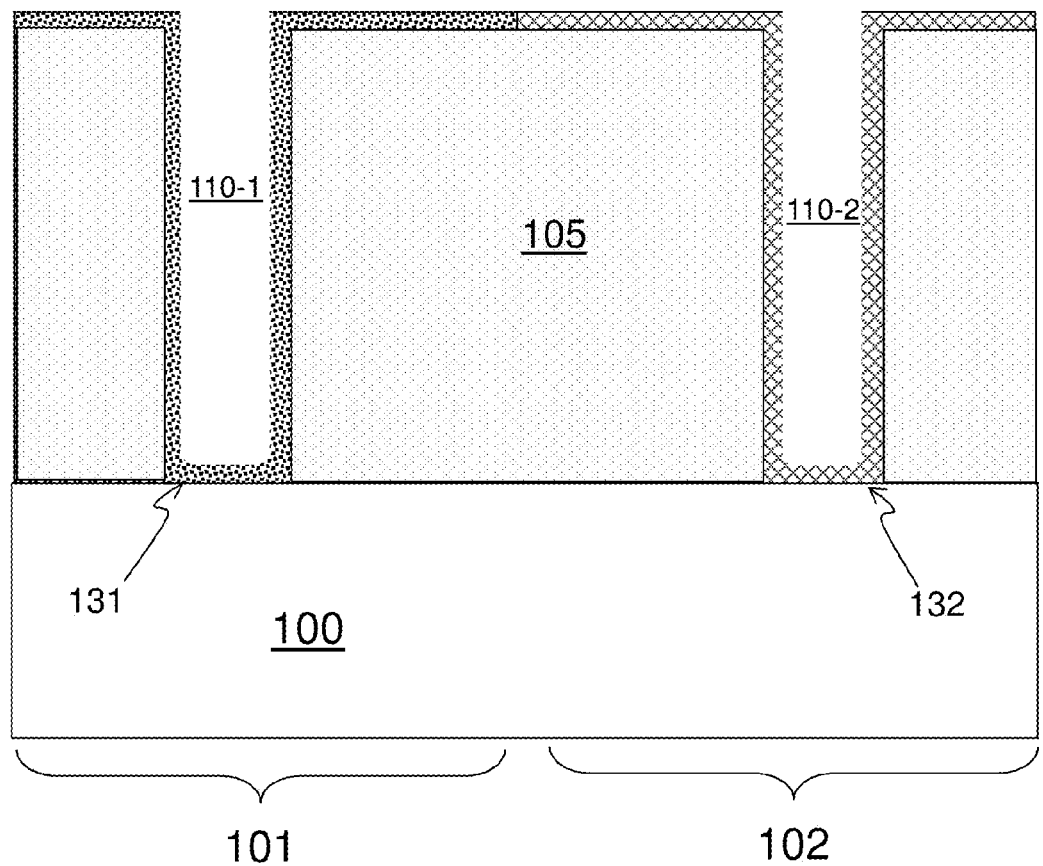
FIG. 5 illustrates the substrate after annealing and removal of dopant and annealing stacks according to an another embodiment of the present invention.

Referring to the left side of FIG. 5 (the N-FET region 101 in this example), the anneal moves the n-dopant, for example lanthanum, of the n-dopant stack 120-1 into the high k material to form an n-doped high-k material 131. Turning to the right side of FIG. 5 (the P-FET region 102 in this example), the p-dopant, preferably Aluminum, of the p-dopant stack 120-2 also migrates into the high-k material 115 upon anneal to form a p-doped high-k material 132. However, in the P-FET region 102, the n-dopant of the n-dopant stack 120-1 is not able to migrate to the high k material in because it is blocked by the tri-layer p-dopant stack 120-2. In either case, the dopant may migrate toward the interfacial layer and higher-k material interface of the high-k material. There, the dopant may form an oxide or silicate or both.

Referring to FIGS. 4b and 5, after the anneal, the dopant stacks 120-1 and 120-2 and the annealing stack 125 are removed. Removal is using a sequence of wets processes, typically involving ammonia based chemistry to remove silicon, peroxide and HCl and ammonia based chemistries (SC1, SC2) to remove the TiN and the dopant materials. Choice of chemistry is motivated by efficiency in removing these materials while retaining high selectivity to the High-k material.

Figure 6:
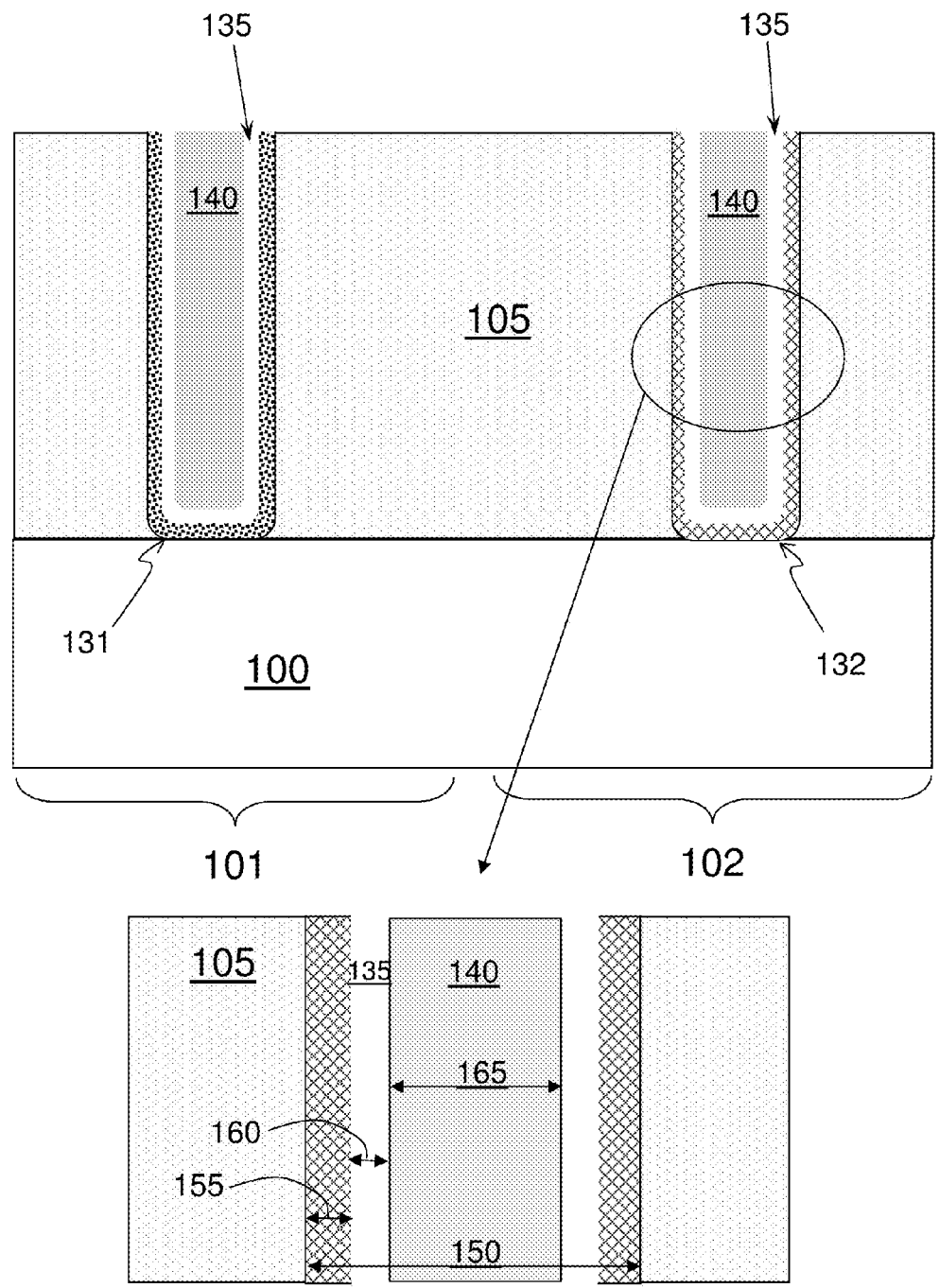
FIG. 6 illustrates oppositely doped high-k replacement metal gates having single work function metal according to an embodiment of the present invention.

Referring to FIG. 6, a shared work function metal 135 is formed in the openings of both FET regions followed by a bulk fill material 140 and planarization. Here, "shared work function metal" refers to the fact is the same work function metal is used for both the N-FET and the P-FET. This is in contrast to other methods in which the gate of the N-FET and the P-FET received different stacks of materials as the work function metals. The shared work function metal 135 may be a stack of several layers of material, but in a preferred embodiment, the shared work function metal 135 may be a titanium nitride (TiN) layer which is deposited and thermally annealed to set the work-function. A typical thickness of such a film could be about 25 Å to about 50 Å and ranges therebetween. Work function setting anneal conditions and methods similar to those previously described in conjunction with dopant drive in. In preferred embodiment, the bulk fill 140 material is a relatively low resistance material compared to the WF metal. An example of a bulk film 140 material is tungsten which may have a bulk resistivity less than about 10 um-cm. The bulk fill 140 material may include a wetting material between the shared WF metal 135 and the lower resistivity metal, for example tungsten.

Referring to the lower portion of FIG. 6, the widths of various features of the replacement metal gate are referenced. For example, the dummy gate opening width 150 is indicated by the double arrow as is the doped gate oxide width 155 (in a high-k last embodiment), shared work function metal width 160 and the bulk fill width 165.

A first important feature of the present invention is that the shared work-function metal 135 itself is only a few tens of Angstroms (Å) thick. As mentioned above, the thickness of the WF metal 135 in an embodiment may be about 25-50 Å, with a typical thickness about 30 Å. Referring to FIG. 6, a 30 Å thickness of WF metal means that across the width of the gate opening 150, the work function metal 135 width 160 would be a total of 6 nm (3 nm on each side). Thus, the remaining space in the gate opening may be used for the bulk fill 140 (in a high-k first embodiment). This reduction of WF metal to 6 nm, as opposed to over 10 nm expected for conventional methods, provides additional room for the bulk fill material, which can have a significant impact on device performance through reduction of RC time delay. For example, if the dummy gate opening width 150 is 17 nm, using a "high-k last" process as illustrated in FIGS. 2-6, the present invention would allow for about 20%-55% of the gate opening width 150 to be bulk fill width 165 in both the N-FET and P-FET gate (the range depending on doped oxide width 155 and work function metal width 160). In contrast, a replacement metal gate process which does not have the shared WF metal 135 of the present invention would have one gate type with additional WF metals which consume a substantial amount of the opening width so that only about 0-10% space is available as the bulk fill width 165. For the same gate opening width 150 of 17 nm, a "high-k first" process with a shared work function metal 135 will allow for about 40-70% and ranges therebetween of space to be bulk fill width 165. In contrast, replacement metal gate process which does not have the shared WF metal 135 of the present invention would have at least one gate type (P-FET, for example) only having about 30% space available as the bulk fill width 165. Similar calculations for a 14 nm gate opening width 150, allow for up to about 45% of the opening to be occupied by bulk fill width 165 in a "high-k last" replacement gate process having a shared work function metal 135 in accordance with the present invention. In a "high-k first" replacement gate process having a shared work function metal 135 in accordance to the present invention may have about 30% to about 65% and ranges therebetween of opening dedicated to bulk fill width 165.

A second important point of the present invention is that the effective work function of the N-FET is a combination of the inherent work function of the work function metal (TiN of the preferred embodiment) and the additional work function reduction caused by the electric dipole/charges due to the n-dopant (for example, lanthanum) diffused into the high k material. Effective work functions of the N-FET have been demonstrated to be 5.5 to 4.35 eV and ranges therebetween. Similarly, the effective work function of the P-FET is a combination of the inherent work function of the work function metal (TiN of the preferred embodiment) and the additional work function increase caused by the electric dipole/charges due to the p-dopant (for example, aluminum) diffused into the high k material.

Taken together, these two points mean that there is a substantial amount of room in the gate opening to fill the bulk metal while the work function is set by doping. The result is a lower resistance gate contact. Another advantage of the above described method is that only a single mask was needed to incorporate the dopants and set separate N-FET and P-FET work functions. In addition, there is a substantial benefit of PBTI (positive bias temperature instability) with the same Tinv (inverse of gate capacitance) and threshold voltage (Vt). PBTI directly depends on the work function of the NFET work function metal stack that is deposited on the NFET. The higher the work function the lower (i.e. better) the PBTI. The present invention allows the use of a work function metal that has substantially higher work function because the NFET Vt can be reduced using a dipole-induced Vt shift that lanthanum provides. Therefore, a low NFET Vt that is needed for optimal device performance is achieved, but simultaneously improved PBTI through the use of a high work function metal is also achieved.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadcast interpretation so as to encompass all such modifications and equivalent structures and functions.

We claim:

1. A method of forming an N-FET metal gate and a P-FET metal gate sharing the same work function metal, the method comprising:
    providing a dielectric layer over a substrate wherein the dielectric layer has a first opening in an N-FET region of the substrate and a second opening in a P-FET region of the substrate, wherein a portion of the substrate is exposed at a bottom of the first opening and the second opening;
    forming a p-doped high dielectric constant material only along a bottom of the second opening in direct contact with the portion of the substrate exposed at the bottom of the second opening;
    forming an n-doped high dielectric constant material only along a bottom of the first opening in direct contact with the portion of the substrate exposed at the bottom of the first opening;
    forming a work function metal above and in direct contact with the p-doped high dielectric constant material and the n-doped high dielectric constant material; and
    filling the first opening and the second opening with a bulk fill material directly on top of the work function metal, wherein a width of the bulk fill material comprises more than about 30% of the width of each of the first opening and the second opening, wherein the work function metal is less than about 40 angstroms thick, and wherein the width of the first opening and the second opening are each less than 20 nanometers.

2. The method of claim 1 further comprising:
    annealing the work function metal, the p-doped high dielectric constant material, and the n-doped high dielectric constant material to set an effective work function of the N-FET metal gate and the P-FET metal gate, wherein the work function metal is a titanium nitride layer having a thickness ranging from about 25 angstroms to about 50 angstroms.

3. The method of claim 1, further comprising:
    forming a p-dopant stack on top of a high dielectric constant material and lining the second opening; and
    forming an n-dopant stack on top of a high dielectric constant material and lining the first opening.

4. The method of claim 3, further comprising:
    diffusing n-dopants from the n-dopant stack into the high dielectric constant material lining the first opening thereby forming a first doped high dielectric constant material; and
    diffusing p-dopants from the p-dopant stack into the high dielectric constant material lining the second opening thereby forming a second doped high dielectric constant material.

5. The method of claim 4, wherein the p-dopant stack comprises aluminum.

6. The method of claim 4, wherein the n-dopant stack comprises lanthanum.

7. The method of claim 1, wherein an effective work function of the N-FET metal gate is a combination of an inherent work function of the work function metal and the additional work function reduction caused by n-dopants of the n-doped high dielectric constant material, and an effective work function of the P-FET metal gate is a combination of an inherent work function of the work function metal and the additional work function increase caused by p-dopants of the p-doped high dielectric constant material.

8. A method comprising:
    forming a first opening and a second opening in a dielectric layer on top of a substrate;
    forming a p-doped high-k dielectric layer conformally within the second opening such that the p-doped high-k dielectric layer is in direct contact with a portion of the substrate exposed at a bottom of the second opening;
    forming an n-doped high-k dielectric layer conformally within the first opening such that the n-doped high-k dielectric layer is in direct contact with a portion of the substrate exposed at a bottom of the first opening;
    forming a shared work function metal conformally within the first opening and the second opening above and in direct contact with both the p-doped high-k dielectric layer and the n-doped high-k dielectric layer; and
    filling the first opening and the second opening with a bulk fill material above and in direct contact with the shared work function metal.

9. The method of claim 8, wherein the first opening is in an N-FET region of the substrate and the second opening is in a P-FET region of the substrate.

10. The method of claim 8, wherein the p-doped high-k dielectric layer comprises aluminum.

11. The method of claim 8, wherein the n-doped high-k dielectric layer comprises lanthanum.

12. The method of claim 8, wherein the shared work function metal comprises titanium nitride and the bulk fill material comprises tungsten.

13. The method of claim 8, wherein a width of the first opening and the second opening are each less than 20 nanometers, a thickness of the shared work function metal is less than about 40 angstroms, and a width of the bulk fill material is more than 45% of the width of each of the first opening and the second opening.

14. The method of claim 8, wherein an effective work function of the N-FET metal gate is a combination of the inherent work function of the work function metal and the additional work function reduction caused by n-dopants of the n-doped high dielectric constant material, and an effective work function of the P-FET metal gate is a combination of the inherent work function of the work function metal and the additional work function increase caused by p-dopants of the p-doped high dielectric constant material.

15. A method comprising:
forming a first opening and a second opening in a dielectric layer on top of a substrate;
forming a high-k dielectric layer conformally within the first opening and the second opening such that the high-k dielectric layer is in direct contact with a portion of the substrate exposed at a bottom of both the first opening and the second opening;
forming a p-dopant stack of layers conformally within the second opening and directly on top of the high-k dielectric layer, the p-dopant stack of layers comprising a first titanium nitride layer, an aluminum layer, and a second titanium nitride layer on top of and in direct contact with each other, the second titanium nitride layer is in direct contact with the high-k dielectric layer separating it from the aluminum layer to control subsequent diffusion of aluminum into the high-k dielectric layer;
forming an n-dopant stack of layers conformally within the first opening and directly on top of the p-dopant stack of layers, the n-dopant stack of layers comprising lanthanum;
forming an annealing stack above the n-dopant stack, the annealing stack comprising a titanium nitride layer in direct contact with the n-dopant stack and an amorphous silicon layer above and in direct contact with the titanium nitride layer;
forming a p-doped high-k dielectric layer and an n-doped high-k dielectric layer by annealing the annealing stack, the p-dopant stack of layers and the n-dopant stack of layers, and the high-k dielectric layer causing dopants to diffuse from each of the p-dopant stack of layers and the n-dopant stack of layers into the high-k dielectric layer, wherein the amorphous silicon layer of the annealing stack blocks extrinsic oxygen from diffusing into the n-dopant stack and the p-dopant stack during annealing;
forming a single titanium nitride work function metal conformally within the first opening and the second opening above and in direct contact with both the p-doped high-k dielectric layer and the n-doped high-k dielectric layer; and
filling the first opening and the second opening with tungsten above and in direct contact with the single work function metal.

16. The method of claim 15, further comprising:
removing the p-dopant stack of layers and the n-dopant stack of layers selective to the p-doped high-k dielectric layer and the n-doped high-k dielectric layer.

17. The method of claim 15, wherein the first opening is in an N-FET region of the substrate and the second opening is in a P-FET region of the substrate.

18. The method of claim 15, wherein a width of the first opening and the second opening are each less than 20 nanometers, and a thickness of the single work function metal is less than about 40 angstroms, and a width of the bulk fill material is more than 45% of the width of each of the first opening and the second opening.

19. The method of claim 15, further comprising:
annealing the p-doped high-k dielectric layer, the n-doped high-k dielectric layer, and the single titanium nitride work function metal to set an effective work function of a P-FET device of the second opening and an N-FET device of the first opening, wherein the effective work function of the N-FET device is a combination of an inherent work function of the single titanium nitride work function metal and the additional work function reduction caused by n-dopants of the n-doped high-k dielectric layer, and the effective work function of the P-FET device is a combination of an inherent work function of the single titanium nitride work function metal and the additional work function increase caused by p-dopants of the p-doped high-k dielectric layer.

20. The method of claim 15, wherein an effective work function of the N-FET metal gate is a combination of the inherent work function of the work function metal and the additional work function reduction caused by n-dopants of the n-doped high dielectric constant material, and an effective work function of the P-FET metal gate is a combination of the inherent work function of the work function metal and the additional work function increase caused by p-dopants of the p-doped high dielectric constant material.

* * * * *